United States Patent
Giduturi et al.

(10) Patent No.: US 7,583,559 B2
(45) Date of Patent: Sep. 1, 2009

(54) TWO TRANSISTOR WORDLINE DECODER OUTPUT DRIVER

(75) Inventors: Hari Giduturi, Folsom, CA (US); Mark Bauer, Folsom, CA (US); Hernan A. Castro, Shingle Springs, CA (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 11/756,419

(22) Filed: May 31, 2007

(65) Prior Publication Data

US 2008/0298158 A1    Dec. 4, 2008

(51) Int. Cl.
*G11C 8/00* (2006.01)
(52) U.S. Cl. .......................... 365/230.06; 365/230.03; 365/230.08; 365/238.5
(58) Field of Classification Search ............ 365/230.06, 365/230.03, 230.08, 238.5
See application file for complete search history.

(56) References Cited

U.S. PATENT DOCUMENTS

| 6,751,126 | B2* | 6/2004 | Kim ...................... 365/185.18 |
| 2005/0032506 | A1* | 2/2005 | Walker ...................... 455/411 |
| 2005/0157576 | A1* | 7/2005 | Sato et al. .................... 365/222 |
| 2007/0076512 | A1* | 4/2007 | Castro et al. ........... 365/230.06 |
| 2008/0144389 | A1* | 6/2008 | Chen et al. ............. 365/185.23 |

FOREIGN PATENT DOCUMENTS

EP           0833343        * 4/1998

* cited by examiner

*Primary Examiner*—Hoai V Ho
*Assistant Examiner*—Fernando N Hidalgo
(74) *Attorney, Agent, or Firm*—Joseph P. Curtin; Cool Patent, P.C.

(57) ABSTRACT

A wordline decoder scheme for a memory device is generally described. In one example, a memory device includes a distributed logical NOR gate to decode addressing signals to generate wordline selection signals within a block of memory wherein the distributed logical NOR gate comprises a wordline decoder output driver, the wordline decoder output driver comprising two transistors coupled with a wordline signal.

7 Claims, 3 Drawing Sheets

US 7,583,559 B2

TWO TRANSISTOR WORDLINE DECODER OUTPUT DRIVER

TECHNICAL FIELD

Embodiments of the present invention are generally directed to the field of memory circuits and, more particularly, to a wordline decoder scheme.

BACKGROUND

Generally, reading and writing data to locations in physical memory devices include translation of a corresponding address into row and column coordinates within the memory devices. The transistors of the wordline decoding circuitry operate to decode address signals to the memory and assert the respective wordlines. Wordline decoding circuitry includes a wordline decoder output driver, which typically includes three or more transistors that perform the function of a logical AND. In a typical arrangement, the wordline decoder output driver is replicated for each wordline. For example, in a block of memory having 16 wordlines, four-transistor wordline decoder output drivers would include 64 transistors (32 p-type and 32 n-type) in addition to any supporting circuitry.

BRIEF DESCRIPTION OF THE DRAWINGS

Embodiments of the present invention are illustrated by way of example, and not by way of limitation, in the figures of the accompanying drawings in which like reference numerals refer to similar elements and in which.

Figure 1:
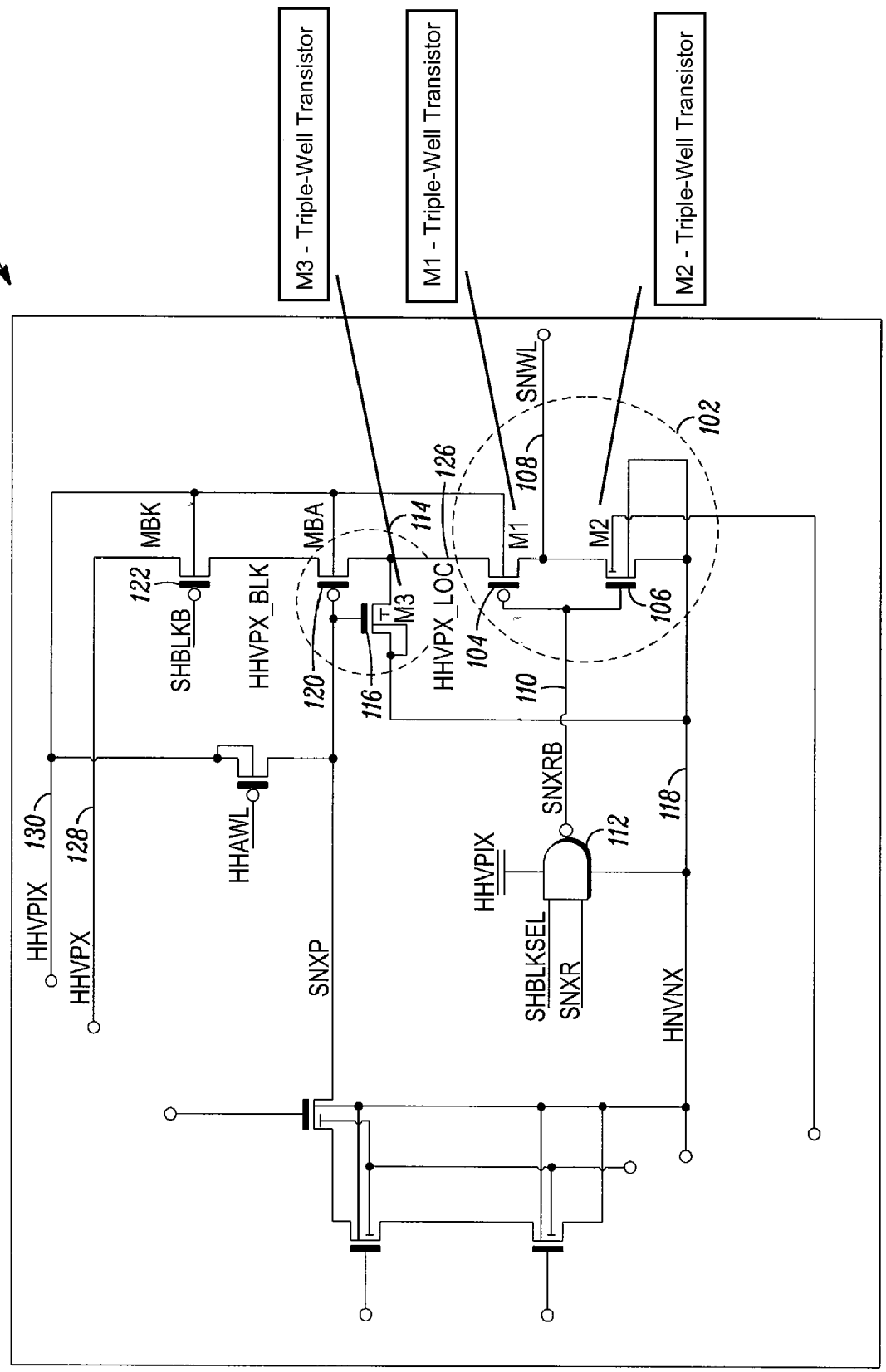
FIG. 1 is a circuit diagram of a word line decoder and supporting circuitry, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of a wordline decoder scheme are described herein. In the following description, numerous specific details are set forth to provide a thorough understanding of embodiments of the invention. One skilled in the relevant art will recognize, however, that the invention can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a circuit diagram 100 of a word line decoder (i.e.—row decoder or x-decoder) and supporting circuitry, according to but one embodiment. In one embodiment, a wordline decoder circuit and supporting circuitry includes a wordline decoder output driver 102 coupled with a p-type bank enable transistor 120 shared with other word line decoding circuits making a "distributed" NOR gate. A distributed logical NOR gate may decode addressing signals 110 to generate wordline selection signals 108 within a block of memory. These signals 110 may be common to all banks in a block, in one embodiment.

In an embodiment, a flash memory array includes a number of flash memory cells typically arranged in a matrix with 512 rows called wordlines and 2048 columns called bitlines. In an exemplary arrangement, a block includes 512 rows of wordlines, but is not limited in this regard. The block may also comprise banks of wordlines, each bank including any convenient number of wordlines (i.e.—2, 4, 8, 16, 32, 64, and so forth). During normal operation, only one wordline in a block will be selected at any point in time, while the remaining 511 wordlines are deselected. Wordline decoding circuitry is associated with each wordline.

Reducing the number of transistors in wordline decoding circuitry provides several benefits. For example, reducing the number of transistors per wordline may significantly reduce the size of a memory device, which lowers manufacturing costs by enabling the production of more memory devices on a single wafer. Furthermore, users and consumers of memory devices continue to find emerging applications for shrinking memory devices. A reduction in the number of transistors associated with wordline decoding circuitry may also reduce routing congestion and complexity in the layout while reducing the effective parasitic capacitance in the wordline driver output path, making the circuit faster for a given size of transistor.

A wordline decoder for selecting and deselecting wordlines of a flash memory array requires a wordline decoder output driver 102 for each wordline 108, according to an embodiment. In an embodiment, a wordline decoder output driver 102 consists of two transistors 104 and 106, coupled as shown. In one embodiment, a wordline decoder output driver 102 includes two transistors 104, 106 (M1, M2) coupled with a wordline signal 108 as shown. Such arrangement provides two transistors per wordline in the wordline decoder output stage.

In an embodiment, transistor 104 is a p-type transistor 104 having a source coupled with a drain of a p-type bank enable transistor 120 (MBA) and a gate coupled to receive a row decode signal SNXRB 110. In another embodiment, transistor 106 is an n-type transistor 106 having a drain coupled with the drain of the p-type transistor 104 and a gate coupled to receive the row decode signal 110. In one embodiment, row decode signal 110 may be an output of a ratioed logic level shifter 112. A wordline in a bank is selected using the SNXR signals driving the NAND gate 112. The output of NAND gate 112 may be common to all banks in one embodiment. In an embodiment, transistor 106 is a triple-well transistor. In yet another embodiment, transistors 104, 106, or 120, or combinations thereof are triple-well transistors.

All or nearly all wordlines in a block should be grounded before selecting a new address to prevent potential read and program failures caused by leakage. Such grounding ensures that the floating wordlines remain deselected and that all of the flash cells on those wordlines remain turned off during an access. Grounding all wordlines at the beginning of an access is accomplished by disabling all row decode signals 110 according to one embodiment.

Charge-sharing of parasitic capacitance on node HHVPX_LOC 126 with the grounded-floating wordlines during address switching may create a potential issue with decoding circuitry depicted in circuit diagram 100. For example, in a selected bank, the HHVPX_LOC node 126 will pre-charge to HHVPX voltage 128, which provides the carrier voltage applied to wordlines. When an address transition occurs from one bank to another, this node 126 may charge share with the floating wordline in a previously selected bank. This may cause wordlines to rise in voltage and contribute to leakage through the cells on the floating wordlines leading to read and program failures. Transistor 116 may mitigate such charge sharing.

In an embodiment, circuit diagram 100 includes a transistor 116 (M3) to discharge node HHVPX_LOC 126 upon deselection. In an embodiment, the transistor 116 is provided to discharge the potentially parasitic node 126 upon deselection prior to an access. According to an embodiment, transistor 116 has a source coupled with the source of a p-type transistor 104 in the wordline decoder output driver 102 and a gate coupled with a gate of a p-type bank enable transistor 120. In another embodiment, transistor 116 is an n-type triple-well transistor and is provided once for each bank of wordlines. In another embodiment, transistors 114 including 116 and 120 are provided once for each bank of wordlines. According to an embodiment, each bank comprises 16 wordlines.

In an embodiment, transistor 116 is placed between node HHVPX_LOC 126 and HNVNX node 118, where the HNVNX node 118 provides the voltage applied to the deselected wordlines. Transistor 116 discharges node 126 to node 118 (normally ground) whenever a bank is deselected according to an embodiment. In another embodiment, bank select devices 120 are off when all of the wordlines are being discharged. Ground 118 is typically approximately 0 V, but may also be another selected voltage such as a negative voltage, for example, in other embodiments. In another embodiment, a finite amount of delay is inserted between the bank selection and the row decode signal 110 to ensure that the HHVPX_LOC node 126 is completely discharged before a new wordline is selected. The delay may be implemented in logic in one or more embodiments, although the scope of the claimed subject matter is not limited in this respect.

In another embodiment, circuit diagram 100 includes an optional block select device 122. A block select device 122 may reduce the total capacitance on the HHVPX signal 128 by disconnecting the blocks that are not selected. In an embodiment, block select device 122 is provided once for each block of wordlines and includes a p-type transistor having a source coupled with a wordline carrier voltage 128 and a drain coupled with a bank select device 114. In an embodiment, transistors 122 and 120 together select a particular bank of wordlines in a particular block. The HHVPX signal 128 may be common to a number of blocks in flash memory. Such groups of blocks are called planes. HHVPX 128 carries the voltage applied to the wordlines and depending on the sensing scheme, this voltage can be a fixed value or vary with time according to alternative embodiments.

In an embodiment, signal HHVPIX 130 is the bulk voltage of all p-type transistors in the block. According to one embodiment, p-type transistors include at least bank enable device 120, transistor 104 of the wordline driver, and optional block select device 122. In another embodiment, the minimum HHVPIX 130 voltage is equal to the maximum HHVPX 128 voltage.

Figure 2:
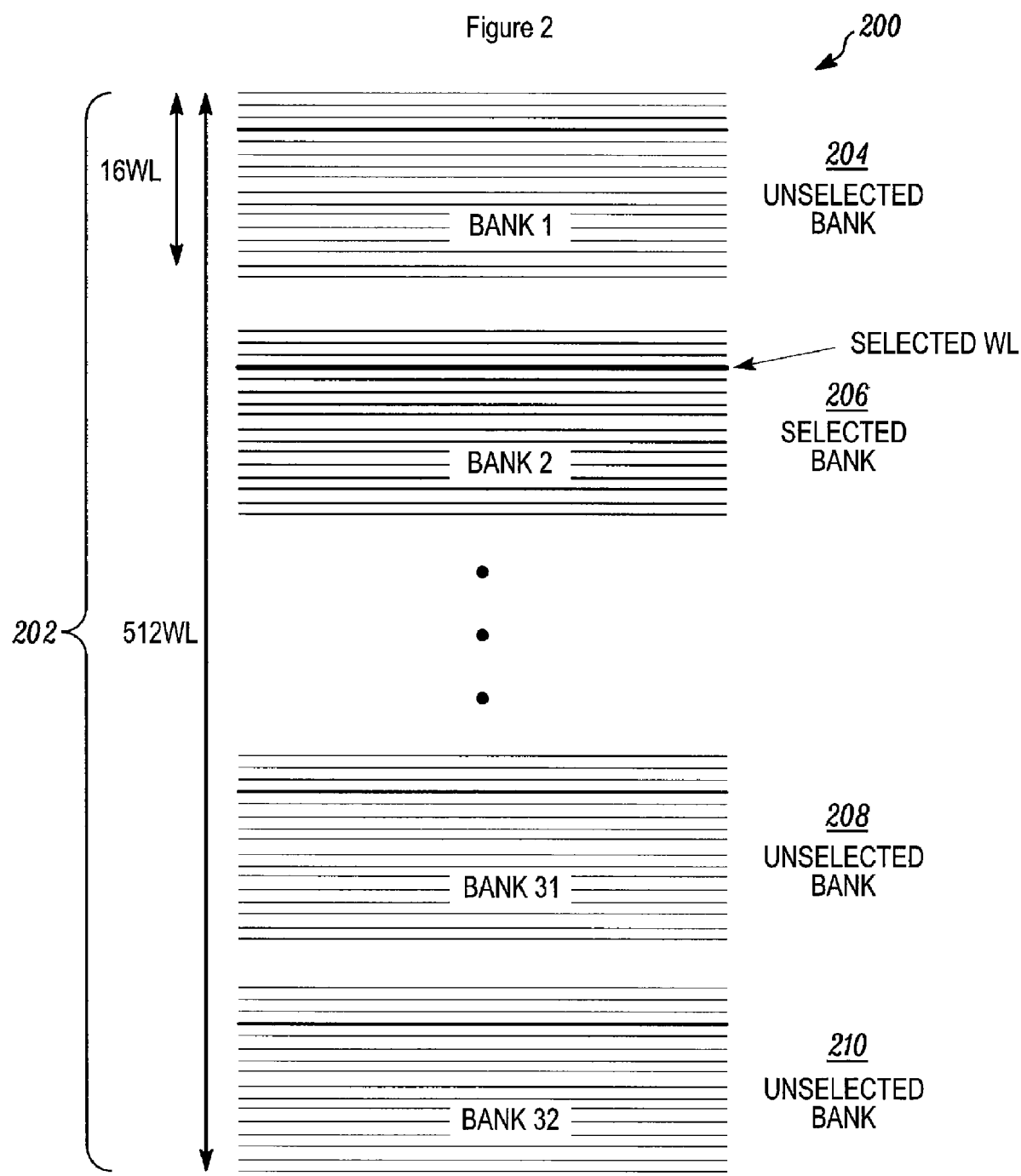
FIG. 2 is a conceptual schematic illustrating an arrangement of wordlines in a memory device, according to but one embodiment.

FIG. 2 is a conceptual schematic 200 illustrating an arrangement of wordlines in a memory device, according to but one embodiment. In an embodiment, a block 202 includes 512 wordlines (WL) where the wordlines have been organized into 32 banks 204, 206 . . . 208, 210 with 16 wordlines in each bank. Banks 204, 206 . . . 208, and 210 have been depicted for clarity, however, the plurality of banks that have been omitted from schematic 200 between bank 206 and bank 208 pertain to this description as well. In such embodiment, each bank includes 16 wordline decoder output drivers 102 (corresponding with 16 p-type M1 transistors/16 n-type M2 transistors), 1 n-type M3 transistor 116, and 1 p-type MBA transistor 120. Optionally, a block 202 includes 1 p-type MBK transistor 122 per block. Other arrangements where the number of wordlines in each bank or block is different also fall within the scope and spirit of this description. For example, in other embodiments, a bank may include 2, 4, 8, 32, 64, or some other convenient number of wordlines.

The output of NAND gate 112 may be common to all banks 204, 206 . . . 208, 210 in one embodiment. As a result, a wordline with the same relative position will be selected (shown in bold) in all the banks 204, 206 . . . 208, 210. For example if the SNXR <3> 110 is selected, then the gates of all fourth wordline output drivers 102 in every bank 204, 206 . . . 208, 210 will go low and all those wordlines will be selected. However, as one bank 206 is selected, the fourth wordline in this bank 206 will have the correct selected wordline voltage. The fourth wordlines of the remaining unselected banks 204, 208, 210 will float as their bank select devices are turned off.

In an embodiment, selected wordlines in a deselected bank 204, 208, 210 are deselected. The active deselection is done prior to the selection phase. The wordline is then held capacitively at the deselected voltage value.

Figure 3:
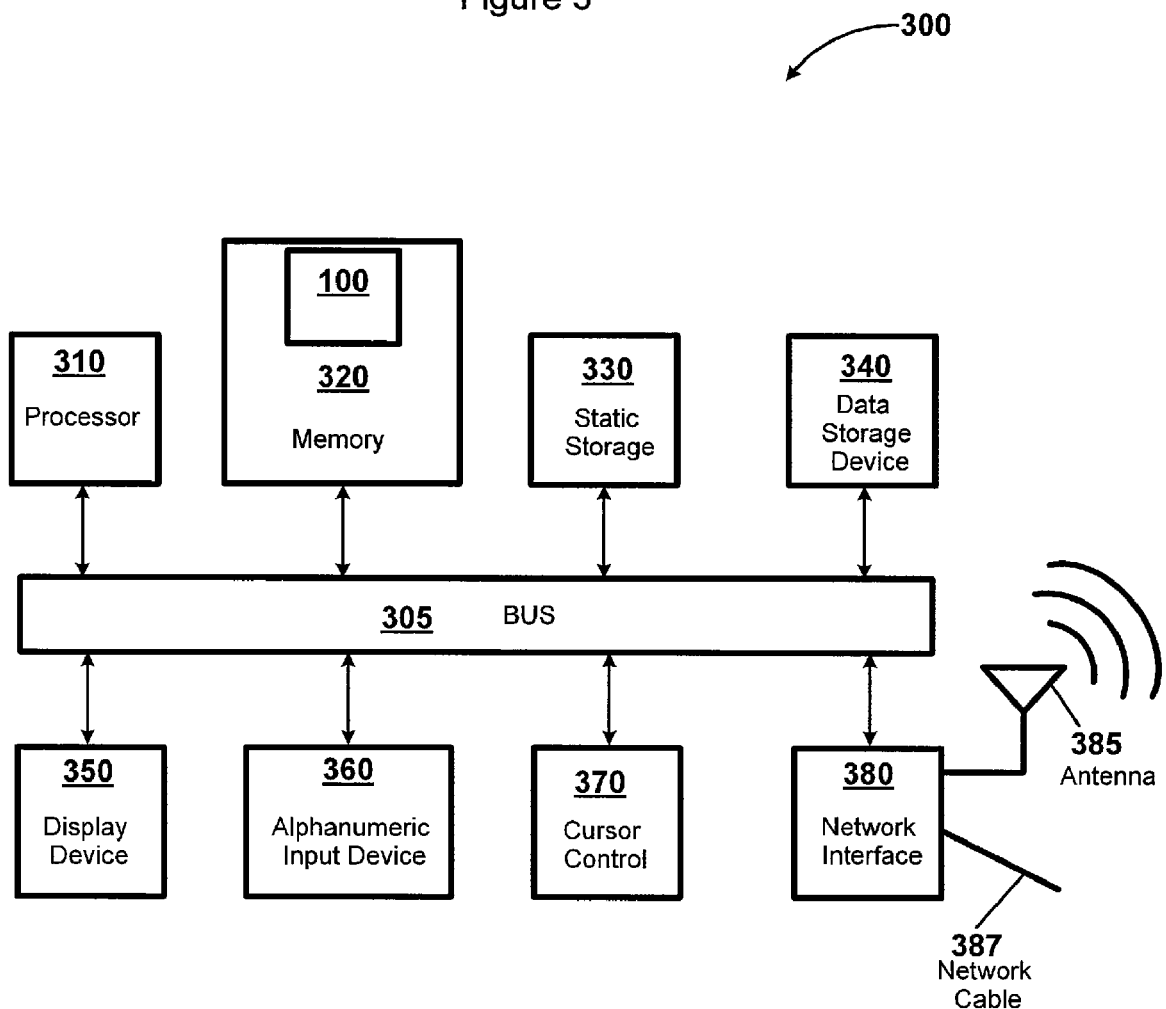
FIG. 3 is a diagram of an example system in which embodiments of the present invention may be used, according to but one embodiment.

FIG. 3 is a diagram of an example system 300 in which embodiments of the present invention may be used, according to but one embodiment. System 300 is intended to represent a range of electronic systems (either wired or wireless) including, for example, desktop computer systems, laptop computer systems, personal computer (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

Electronic system 300 may include bus 305 or other communication device to communicate information, and processor 310 coupled to bus 305 that may process information. While electronic system 300 is illustrated with a single processor, system 300 may include multiple processors and/or co-processors. System 300 may also include random access memory (RAM) or other storage device 320 (referred to as memory), coupled to bus 305 and may store information and instructions that may be executed by processor 310.

Memory 320 may also be used to store temporary variables or other intermediate information during execution of instructions by processor 310. In one embodiment, memory 320 may include an array of memory locations that may be accessed using word line decoding techniques as described herein 100. Memory 320 is a flash memory device in one embodiment.

System 300 may also include read only memory (ROM) and/or other static storage device 330 coupled to bus 305 that may store static information and instructions for processor 310. Data storage device 340 may be coupled to bus 305 to store information and instructions. Data storage device 340 such as a magnetic disk or optical disc and corresponding drive may be coupled with electronic system 300.

Electronic system 300 may also be coupled via bus 305 to display device 350, such as a cathode ray tube (CRT) or liquid crystal display (LCD), to display information to a user. Alphanumeric input device 360, including alphanumeric and other keys, may be coupled to bus 305 to communicate information and command selections to processor 310. Another type of user input device is cursor control 370, such as a mouse, a trackball, or cursor direction keys to communicate information and command selections to processor 310 and to control cursor movement on display 350.

Electronic system 300 further may include one or more network interfaces 380 to provide access to network, such as a local area network. Network interface 380 may include, for example, a wireless network interface having antenna 385, which may represent one or more antennae. Network interface 380 may also include, for example, a wired network interface to communicate with remote devices via network cable 387, which may be, for example, an Ethernet cable, a coaxial cable, a fiber optic cable, a serial cable, or a parallel cable.

In one embodiment, network interface 380 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 380 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 300 includes one or more omnidirectional antennae 385, which may refer to an antenna that is at least partially omnidirectional and/or substantially omnidirectional, a processor 310 coupled to communicate via the antennae, and a memory device coupled 320 with the processor. According to various embodiments, memory device 320 includes embodiments already described for FIGS. 1 and 2, such as in diagrams 100 and 200. In another embodiment, the memory device 320 includes a wordline decoder output driver having a first p-type transistor and a first n-type transistor coupled with a wordline signal. In another embodiment, the first p-type transistor includes a source coupled with a drain of a second p-type bank enable transistor and a gate coupled to receive a row decode signal. In another embodiment, the first n-type transistor includes a drain coupled with the drain of the first p-type transistor and a gate coupled to receive the row decode signal.

In another embodiment, system 300 includes a memory device 320 that includes one or more blocks of memory, each block comprising one or more banks, each bank comprising sixteen wordlines, sixteen wordline decoder output drivers, and one bank enable transistor.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of this description, as those skilled in the relevant art will recognize.

These modifications can be made in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
    a distributed logical NOR gate to decode addressing signals to generate wordline selection signals within a block of memory wherein the distributed logical NOR gate comprises a wordline decoder output driver, the wordline decoder output driver comprising two transistors coupled with a wordline signal, the wordline decoder output driver further comprising
        a first p-type transistor having a source coupled with a drain of a second p-type bank enable transistor and a gate coupled to receive a row decode signal; and
        a first n-type transistor having a drain coupled with the drain of the first p-type transistor and a gate coupled to receive the row decode signal,
        the first p-type transistor, the second p-type bank enable transistor, and the first n-type transistor being triple-well transistors; and
    a second n-type transistor to discharge a parasitic node upon deselection, the second n-type transistor having a source coupled with the source of a first p-type transistor in the wordline decoder output driver and a gate coupled with a gate of a second p-type bank enable transistor, the second n-type transistor being a triple-well transistor and being provided once for each bank of wordlines.

2. An apparatus according to claim 1 further comprising:
    a block select device comprising a third p-type transistor having a source coupled to a wordline carrier voltage and a drain coupled with a bank select device, the bank select device being coupled with the wordline decoder output driver.

3. An apparatus according to claim 2 wherein the block select device is provided once for each block of wordlines.

4. A systems, comprising:
    an omnidirectional antenna;
    a processor coupled to communicate via the antenna; and
    a memory device coupled with the processor, the memory device comprising a wordline decoder output driver having a first p-type transistor and a first n-type transistor coupled with a wordline signal, wherein the first p-type transistor comprises a source coupled with a drain of a second p-type bank enable transistor and a gate coupled to receive a row decode signal, and wherein the first n-type transistor comprises a drain coupled with the drain of the first p-type transistor and a gate coupled to receive the row decode signal, the first p-type transistor, the second p-type bank enable transistor, and the first n-type transistor being triple-well transistors, the wordline decoder output driver further comprising a second n-type transistor to discharge a parasitic node upon deselection, the second n-type transistor having a source coupled with the source of the first p-type transistor and a gate coupled with a gate of the second p-type bank enable transistor, the second n-type transistor being provided to discharge the parasitic node upon deselection prior to an access, and the second n-type transistor being a triple-well transistor and being provided once for each bank of wordlines.

5. A system according to claim 4 further comprising:
a block select device comprising a third p-type transistor having a source coupled to a wordline carrier voltage and a drain coupled with a bank select device, the bank select device being coupled with the wordline decoder output driver.

6. A system according to claim 5 wherein the block select device is provided once for each block of wordlines.

7. A system according to claim 4 wherein the memory device comprises one or more blocks of memory, each block comprising one or more banks, each bank comprising sixteen wordlines, sixteen wordline decoder output drivers, and one second p-type bank enable transistor.

* * * * *

UNITED STATES PATENT AND TRADEMARK OFFICE
CERTIFICATE OF CORRECTION

| | | |
|---|---|---|
| PATENT NO. | : 7,583,559 B2 | Page 1 of 1 |
| APPLICATION NO. | : 11/756419 | |
| DATED | : September 1, 2009 | |
| INVENTOR(S) | : Hari Giduturi et al. | |

It is certified that error appears in the above-identified patent and that said Letters Patent is hereby corrected as shown below:

In column 6, line 59, in Claim 4, delete "systems," and insert -- system, --, therefor.

Signed and Sealed this

Third Day of November, 2009

David J. Kappos
*Director of the United States Patent and Trademark Office*